United States Patent
Mowry et al.

(10) Patent No.: US 7,977,179 B2
(45) Date of Patent: Jul. 12, 2011

(54) DOPANT PROFILE TUNING FOR MOS DEVICES BY ADAPTING A SPACER WIDTH PRIOR TO IMPLANTATION

(75) Inventors: Anthony Mowry, Buda, TX (US); Markus Lenski, Dresden (DE); Guido Koerner, Dresden (DE); Ralf Otterbach, Dresden (DE)

(73) Assignee: GLOBALFOUNDRIES, Inc., Austin, TX (US)

( * ) Notice: Subject to any disclaimer, the term of this patent is extended or adjusted under 35 U.S.C. 154(b) by 400 days.

(21) Appl. No.: 12/108,992

(22) Filed: Apr. 24, 2008

(65) Prior Publication Data

US 2009/0108295 A1 Apr. 30, 2009

(30) Foreign Application Priority Data

Oct. 31, 2007 (DE) .......................... 10 2007 052 220

(51) Int. Cl.
*H01L 21/8238* (2006.01)
*H01L 21/336* (2006.01)

(52) U.S. Cl. ... 438/199; 438/303; 438/306; 257/E21.64; 257/E21.626; 257/E21.634; 257/E21.619

(58) Field of Classification Search .................. 257/369, 257/E27.062, E21.619, E21.626, E21.634, 257/E21.64; 438/199, 306, 303, 595, 938
See application file for complete search history.

(56) References Cited

U.S. PATENT DOCUMENTS

| | | | | |
|---|---|---|---|---|
| 6,479,350 | B1 * | 11/2002 | Ling et al. | 438/265 |
| 6,696,334 | B1 * | 2/2004 | Hellig et al. | 438/230 |
| 6,806,584 | B2 * | 10/2004 | Fung et al. | 257/368 |
| 7,727,870 | B2 * | 6/2010 | Zhang et al. | 438/589 |
| 2005/0190421 | A1 * | 9/2005 | Chen et al. | 359/211 |
| 2006/0118878 | A1 | 6/2006 | Huang et al. | 257/369 |
| 2006/0151776 | A1 * | 7/2006 | Hatada et al. | 257/19 |
| 2007/0020866 | A1 * | 1/2007 | Cheng | 438/301 |

OTHER PUBLICATIONS

Correspondence from foreign associate dated Jul. 21, 2008.

* cited by examiner

*Primary Examiner* — Victor Mandala
*Assistant Examiner* — Scott Stowe
(74) *Attorney, Agent, or Firm* — Williams, Morgan & Amerson

(57) ABSTRACT

By selectively modifying the spacer width, for instance, by reducing the spacer width on the basis of implantation masks, an individual adaptation of dopant profiles may be achieved without unduly contributing to the overall process complexity. For example, in sophisticated integrated circuits, the performance of transistors of the same or different conductivity type may be individually adjusted by providing different sidewall spacer widths on the basis of an appropriate masking regime.

7 Claims, 14 Drawing Sheets

DOPANT PROFILE TUNING FOR MOS DEVICES BY ADAPTING A SPACER WIDTH PRIOR TO IMPLANTATION

BACKGROUND OF THE INVENTION

1. Field of the Invention

The present disclosure generally relates to the fabrication of integrated circuits, and, more particularly, to the fabrication of highly sophisticated circuit elements, such as MOS transistor structures, requiring sophisticated lateral and vertical dopant profiles.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling down of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. For example, so-called short channel effects may occur for highly scaled transistor elements, resulting in reduced controllability of the channel region, which may result in increased leakage currents and generally in degraded transistor performance. One challenging task in this respect therefore is the provision of appropriately designed junction regions in the form of shallow junctions, at least at the area in the vicinity of the channel region, i.e., source and drain extension regions, which nevertheless exhibit a moderately high conductivity to maintain the resistivity in conducting charge carriers from the channel to a respective contact area of the drain and source regions at a relatively low level while also controlling the parasitic drain/source capacitance and the electric field of the cut off region. The requirement for shallow junctions having a relatively high conductivity while providing adequate channel control is commonly met by performing an ion implantation sequence on the basis of a spacer structure to obtain a high dopant concentration having a profile that varies laterally and in depth. The introduction of a high dose of dopants into a crystalline substrate area, however, generates heavy damage in the crystal structure, and therefore one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile, which may be advantageous for defining critical transistor properties, such as the overlap between the extension regions and the gate electrode. Therefore, for highly advanced transistors, the positioning, shaping and maintaining of a desired dopant profile are important properties for defining the final performance of the device, since the overall series resistance of the conductive path between the drain and source contacts, as well as the controllability of the channel region, may represent a dominant aspect for determining the transistor performance.

The definition of the effective channel length and the adjustment of the dopant profile to account for short channel behavior on the basis of conventional well-established anneal and implantation techniques may result in a spacer width that is a compromise for different device types, as will be explained in more detail with reference to FIGS. 1a-1e.

FIG. 1a schematically illustrates a cross-sectional view of a transistor device 100 in an advanced manufacturing stage. The transistor 100 may represent any type of sophisticated field effect transistor as typically used in sophisticated integrated circuits, such as microprocessors, storage chips and the like. The transistor 100 comprises a substrate 101, which may represent any appropriate carrier material for forming thereabove an appropriate semiconductor layer 102, in and above which respective circuit components, such as the transistor 100, are to be formed. For example, the substrate 101 may represent a silicon substrate or any other appropriate material, thereby defining a silicon-on-insulator (SOI) configuration, wherein, in this case, an insulating layer 103 may be provided below the semiconductor layer 102. Furthermore, a gate electrode 105, for instance comprised of polysilicon, may be formed above the semiconductor layer 102 and may be separated therefrom by a gate insulation layer 104. In this manufacturing stage, respective offset spacers 107, which may be comprised of silicon dioxide, silicon oxynitride and the like, are provided with an appropriate thickness 107T, which in turn is selected to define a desired offset of respective extension regions 108E defined by a corresponding dopant species of a specified conductivity type in accordance with the design of the transistor device 100. For instance, for an N-channel transistor, the extension regions 108E may comprise an N-type dopant species.

It should be appreciated that the length of a channel region 106, i.e., in FIG. 1a, the spacing between the extension regions 108E in the horizontal direction, depends on the length of the gate electrode 105 and the spacer width 107T, wherein the actual effective channel length may finally be determined by respective PN junctions formed by the extension regions 108E with the channel region 106. That is, the effective channel length may be adjusted by a controlled diffusion process, as previously explained.

The transistor device 100 as shown in FIG. 1a may be formed on the basis of the following well-established processes. After providing the substrate 101 having formed thereon the buried insulating layer 103 and the semiconductor layer 102, respective isolation structures (not shown), such as shallow trench isolations (STI) and the like, may be formed to define appropriately sized active areas within the semiconductor layer 102, in which one or more circuit components may be formed, such as the transistor 100. For this purpose, sophisticated lithography, etch, deposition and planarization techniques may be used. Subsequently, the doping of the channel region 106 may be adjusted in accordance with transistor requirements. Thereafter, appropriate materials for the gate electrode 105 and the gate insulation layer 104 may be provided, for instance, by oxidation and/or deposition for the gate insulation layer 104 and by deposition of the material of the gate electrode 105, followed by advanced lithography and etch techniques in order to appropriately define the lateral dimensions of the gate electrode 105. For sophisticated applications, the gate length, which also affects the effective channel length, may be in the range of approximately 50 nm and even less for highly advanced semiconductor devices. Next, the offset spacer 107 may be formed on the basis of conformal deposition techniques and/or oxidation processes followed by an etch process, wherein the initial layer thickness and the respective etch conditions may substantially determine the width 107T. Furthermore, an implantation process 110 is performed to introduce the required dopant species for defining the extension regions 108E, wherein a respective offset to the gate electrode 105 may be obtained by the offset spacers 107. It should be appreciated that other implantation processes may be performed, such as a pre-amorphization implantation, a halo implantation and the like, depending on the device requirements.

FIG. 1*b* schematically illustrates the transistor device 100 in a further advanced manufacturing stage. As shown, a further spacer element 111 may be provided to define, in combination with the offset spacer 107 and a corresponding etch stop layer 112, if provided, a spacer structure 113. The spacer structure 113 may also comprise additional individual spacer elements (not shown), depending on the respective process requirements. The spacer element 111 may be comprised of any appropriate material, such as silicon nitride, and may have a width adapted to define deep drain and source portions 108D formed by a respective implantation process 114. For driving the deep drain and source regions 108D towards a desired depth, for instance, towards the buried insulating layer 103, the corresponding lateral diffusion may also have to be accommodated by the spacer width 111W. Thus, the overall width of the spacer structure 113 may be correlated with the overall configuration of the drain and source regions comprising the extension region 108E and the deep drain and source region 108D, wherein the spacer width 111W and the thickness 107T (FIG. 1*a*) may also be correlated in order to obtain a desired effective channel length and an appropriate dopant profile for the desired performance characteristics after a corresponding anneal process.

FIG. 1*c* schematically illustrates the transistor device during a corresponding anneal process 115, wherein respective process parameters, that is, the effective anneal temperature and the duration of the process, may be selected such that desired lateral and vertical profiles of the drain and source regions 108D, 108E (FIG. 1*b*) are obtained.

However, sophisticated semiconductor devices typically comprise a plurality of different circuit elements, which may be formed in accordance with a well-established common manufacturing sequence, while the final performance of the circuit elements may differ significantly from each other so that the dopant profile obtained during the above-described process sequence may not result in optimum performance of each of the different circuit elements. For example, using the above-described conventional strategy for establishing an appropriate profile for transistor elements, such as PMOS transistors and NMOS transistors, or obtaining dopant profiles for different circuit architectures, such as analog or digital circuits, may require selecting the respective process parameters and dimensions of device features to obtain a dopant profile that meets the requirements for any of these different transistor elements. For example, the adjustment of certain transistor characteristics, such as high threshold voltage or low threshold voltage, the type of dopant used in order to obtain the appropriate conductivity type and the like, may be accomplished on the basis of various masking and implant sequences wherein, however, the fundamental positioning of the dopant may not be efficiently changed according to the above-described conventional process strategy. In a recent technology development, transistor performance of sophisticated CMOS devices may be enhanced by providing an appropriate semiconductor alloy, such as silicon/germanium, in the drain and source regions of the transistors in order to create a desired type of strain in the adjacent channel region. Due to the induced strain, the charge carrier mobility may be increased in the channel region, thereby compensating for certain mobility degradation effects that may have been created in an attempt to reduce short channel effects. Furthermore, based on a specific channel length, the overall transistor performance may be increased for a given technology standard since an increased charge carrier mobility directly translates into an increased current drive capability and thus increased operating speed of the transistor. However, providing silicon/germanium alloy in a significant portion of the drain and source regions of a P-channel transistor may have a significant influence on the finally obtained dopant profiles, since, for instance, the diffusivity of certain P-type dopants, such as boron, may be significantly less in the presence of a moderately high germanium concentration compared to the boron diffusion in a silicon material. Consequently, when P-channel transistors of substantially conventional design and high speed P-channel transistors are to be provided in the same semiconductor device, the above-described conventional manufacturing process may have to take into consideration further types of transistor devices, as will be described in more detail with reference to FIGS. 1*d*-1*e*.

FIG. 1*d* schematically illustrates the semiconductor device 100 for this case. A first transistor 100A and a second transistor 100B may be provided in different device regions and may represent P-channel transistors requiring a different type of performance behavior. For instance, the transistor 100A may represent a transistor in a device region requiring low leakage behavior while the switching speed may not be as essential as for the second transistor 100B. In principle, the transistors 100A, 100B may have the same configuration as the transistor 100 as shown in FIGS. 1*a*-1*c*, except for a silicon/germanium alloy 116 formed in a portion of the semiconductor layer 102 (FIG. 1*c*), in which drain and source regions are to be formed on the basis of a respective implantation process 117. As explained above, the implantation parameters, in combination with the overall transistor configuration, may be selected such that a compromise may be obtained after the implantation process 117 for the drain and source regions 108 to obtain a moderately high performance for the transistor 100A and for the transistor 100B.

FIG. 1*e* schematically illustrates the semiconductor device 100 during the anneal process 115 for finally defining the dopant profile of the drain and source regions 108, for instance, in view of defining an effective channel length, as previously explained. Due to the reduced diffusivity of boron, which may be introduced during the implantation process 117, the vertical and lateral diffusion length in the transistor 100B may be reduced compared to the device 100A, thereby resulting in non-optimal dopant profiles or obtaining an optimized dopant profile for one of the transistors 100A, 100B, while significantly reducing device performance for the other one of the transistors 100A, 100B. For instance, as shown in FIG. 1*e*, the transistor 100*a* may have a desired dopant profile for reducing the overall drain/source resistance with a moderate parasitic capacitance, while the transistor 100B may exhibit an increased source/drain resistance for the benefit of a reduced drain/source capacitance, thereby possibly offsetting to a certain degree the performance gain obtained by the provision of the strained silicon/germanium alloy 116.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing performance of circuit elements separately for different types of circuit elements, such as field effect transistors of the same or different connectivity type, capacitive and/or resistive devices formed on a semiconductor region in a common manufacturing sequence with transistor elements, by appropriately adapting a lateral dimension of a device feature acting as an implantation mask in order to appropriately adapt the location of dopant penetration for a circuit element under consideration. That is, the principles disclosed herein enable an individual adaptation of dopant profiles by locally varying the masking effect of device features alternatively or additionally to modifying implantation dose or energy in order to individually obtain a desired performance of the device feature under consideration. In some illustrative aspects disclosed herein, sidewall spacer structures are differentially sized according to a process flow associated with the implantation of a desired dopant species, thereby avoiding or at least significantly reducing the necessity for any additional processes compared to well-established conventional strategies, for instance by using an implantation mask for concurrently adapting the shielding effect of a device feature, such as a gate electrode structure. Thus, in some illustrative examples, a given parameter setting of an implantation sequence may commonly be used for different device features while nevertheless individually adjusting the finally obtained dopant profile. In other illustrative cases, in addition to appropriately selecting implantation parameters, the adjustment of the lateral shielding effect of a device feature, such as a gate electrode comprising a sidewall spacer structure, may represent an additional control mechanism for individually enhancing the overall device performance.

One illustrative method disclosed herein comprises forming a first implantation mask above a first device region and a second device region of a semiconductor device, wherein the first implantation mask covers the second device region and exposes the first device region. Moreover, the method comprises performing a first implantation process on the basis of a first parameter setting to define a first dopant profile laterally adjacent to a first device feature that is formed above the first device region. Moreover, a second implantation mask is formed above the first and second device regions, wherein the second implantation mask covers the first device region and exposes the second device region. Additionally, a lateral extension of a second device feature formed above the second device region is reduced by using the second implantation mask as an etch mask. Finally, the method comprises performing a second implantation process on the basis of a second parameter setting to define a second dopant profile laterally adjacent to the second device feature.

A further illustrative method disclosed herein comprises forming a first device feature and a second device feature above a semiconductor layer of a semiconductor device. Furthermore, a first sidewall spacer structure is formed on sidewalls of the first device feature and a second sidewall spacer structure is formed on sidewalls of the second device feature. The method further comprises forming a first implantation mask configured to expose a first device region comprising the first device feature and to cover a second device region comprising the second device feature. A first dopant species is implanted into the first device region and a width of the second sidewall spacer structure is modified. Moreover, a second dopant species is implanted into the second device region on the basis of a second implantation mask, which covers the first device region and exposes the second device region.

One illustrative semiconductor device disclosed herein comprises a first gate electrode structure comprising a first sidewall spacer structure having a first width, wherein the first gate electrode structure is formed above a first semiconductor region including first drain and source regions. The semiconductor device further comprises a second gate electrode structure comprising a second sidewall spacer structure having a second width that differs from the first width, wherein the second gate electrode structure is formed above a second semiconductor region including second drain and source regions. Additionally, the semiconductor device comprises a semiconductor alloy formed in the second semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
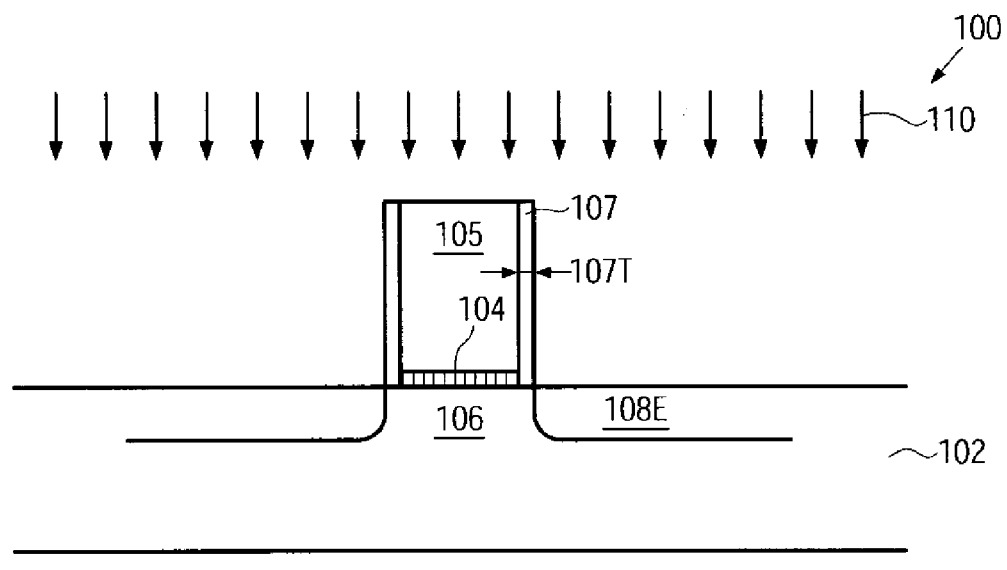
FIGS. 1a-1c schematically illustrate cross-sectional views of a transistor device during various manufacturing stages in forming drain and source regions on the basis of a conventional process flow using one or more spacer elements of the same width in each transistor element in order to adjust the effective channel length and the dopant profile.
Figure 1B:
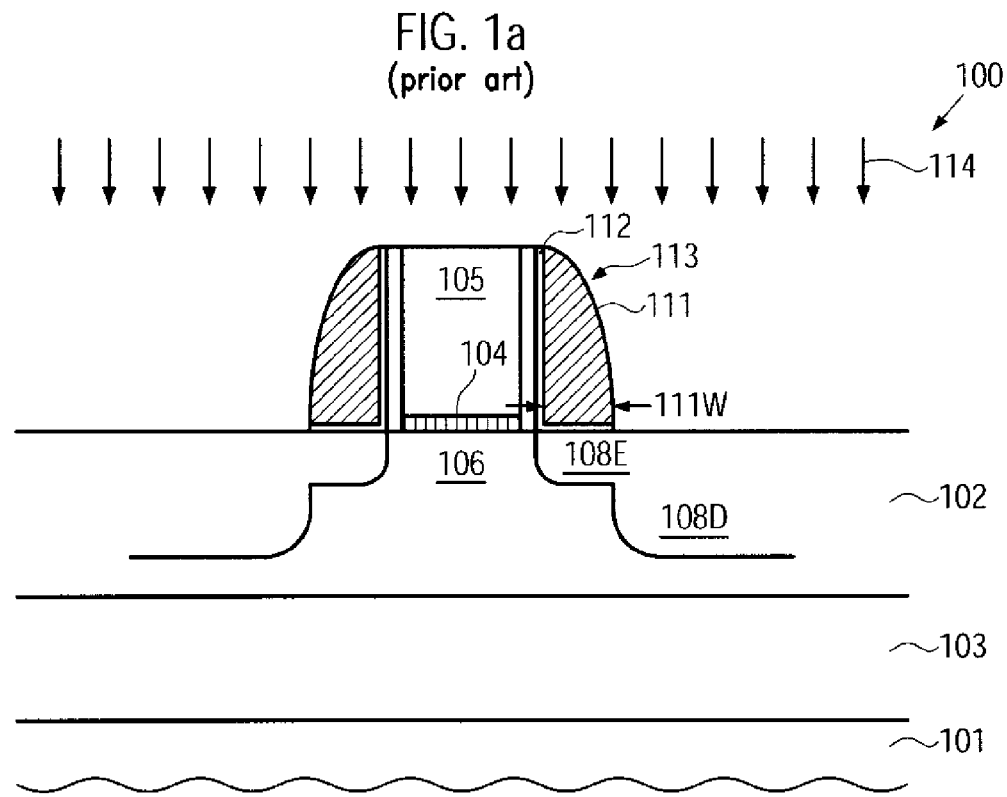
Figure 1C:
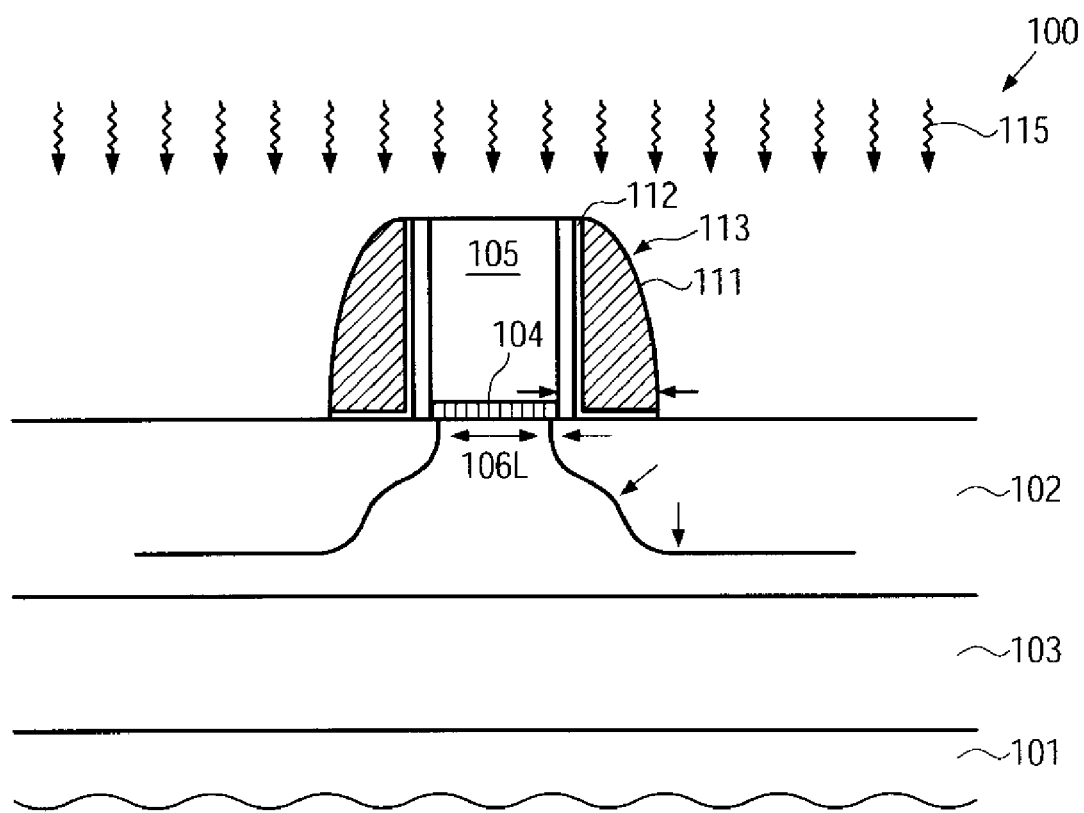

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein generally relates to manufacturing techniques for forming circuit elements, such as transistor elements, capacitive structures, resistive structures and the like, in which a vertical and lateral dopant profile in an active region of a semiconductor layer may be efficiently adjusted by individually adapting the lateral extension of a device feature, such as a gate electrode structure, polysilicon lines or regions and the like, by an implantation mask in order to define the entry area during an implantation process. For this purpose, efficient process flows and respective semiconductor devices are disclosed, in which well-established masking regimes, as may be required for appropriately providing dopant species in various device regions, may be combined with efficient etch and deposition techniques to individually adapt the point of entry of a dopant species in these device regions. In some illustrative aspects, the spacer width of gate electrodes of advanced transistor elements may be appropriately modified in their shielding effect during an implantation sequence for forming sophisticated drain and source dopant profiles, wherein different characteristics in diffusivity, transistor configuration and the like may be taken into consideration by appropriately laterally positioning the point of entry of respective dopant species. Thus, contrary to conventional approaches in which an individual adaptation of implantation parameters may require sophisticated and additional lithography steps, the principles disclosed herein provide enhanced flexibility in adjusting the dopant profiles and thus the device performance while substantially avoiding the introduction of additional lithography steps, or by providing an additional degree of freedom in adjusting the overall device characteristics by allowing, in addition to a variation of the implantation parameters, an individual adjustment of the point of implantation. In some illustrative aspects disclosed herein, a differential sizing of sidewall spacer structures may be achieved by using standard lithography masking and etching and/or deposition approaches, thereby providing efficient and cost-effective overall process flow. At the same time, both device features including a respective sidewall spacer structure may be formed in a common manufacturing sequence so as to provide an initially similar size, which may then be modified prior to introducing the dopant species under consideration. Thus, important device characteristics, such as an overlap of drain and source regions with a gate electrode of field effect transistors, even for very different diffusivity characteristics of species in the various transistors, may be adjusted on the basis of a highly efficient process flow, while nevertheless maintaining a high degree of compatibility with conventional MOS strategies.

It should be appreciated that the principles disclosed herein are highly advantageous in the context of semiconductor devices including device features having critical lateral dimensions of approximately 50 nm and less, such as gate electrode structures, since here pronounced dopant profiles at the PN junctions are required, while also a device-specific position of the PN junctions may result in enhanced transistor performance. The techniques disclosed herein may also be advantageously applied to other circuit elements, such as capacitors, resistors and the like, when the dopant profile in the respective active regions may allow an individual enhancement of the device performance. As previously mentioned, the techniques disclosed herein may be efficiently used to even adapt the performance characteristics of extended device regions, such as logic blocks, analog circuit blocks and the like, as well as an individual adaptation in a localized manner, for instance, for a complementary transistor pair, wherein, in addition to varying the implantation parameters, the point of implantation may also be efficiently adjusted on the basis of standard masking regimes for P-channel transistors and N-channel transistors, thereby not substantially contributing to enhanced process complexity. That is, typically, a plurality of implantation steps may frequently be associated with specific classes of devices in an overall circuit, wherein the implantation steps may be efficiently used to adjust resulting dopant profiles without adding any extra masking-related efforts. Thus, a plurality of critical device parameters, such as an increase of operating speed of transistors, reducing threshold roll off, leakage currents, controlling of short channel effects, source/drain series resistance and the like, may be individually enhanced in individual circuit features or in respective device regions. Thus, the present disclosure should not be considered as being restricted to specific device dimensions and devices, unless such restrictions are explicitly set forth in the appended claims.

Figure 2A:
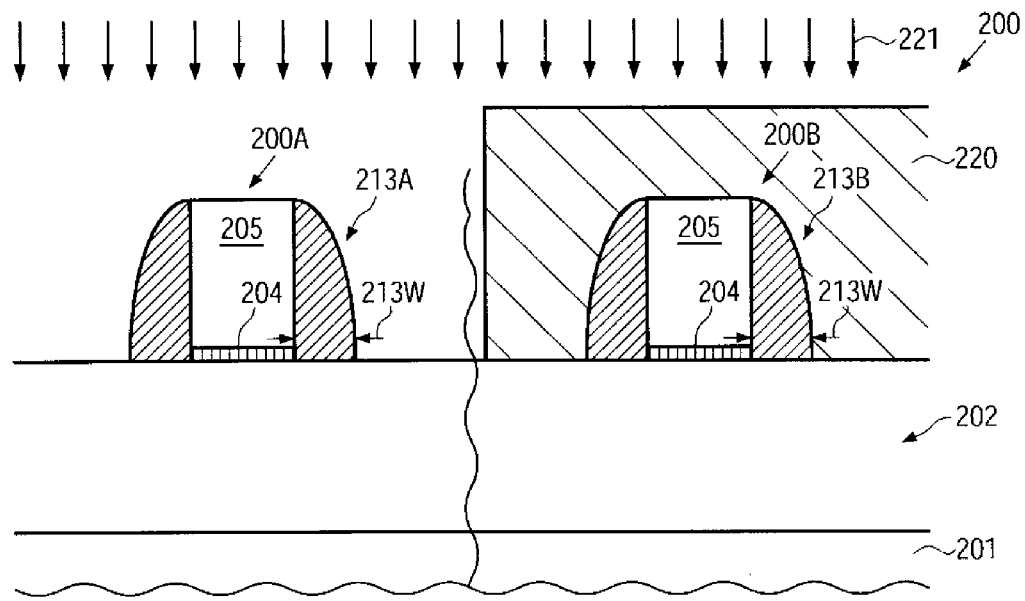
FIGS. 2a-2d schematically illustrate cross-sectional views of a semiconductor device including different device features, such as gate electrode structures for different transistors, in which a lateral and vertical dopant profile may be defined individually by appropriately adapting the width of the sidewall spacer structure prior to an implantation process, according to illustrative embodiments.

FIG. 2a schematically illustrates a cross-sectional view of a semiconductor device 200 comprising a substrate 201, above which may be formed a semiconductor layer 202, such as a silicon-based semiconductor layer, wherein it should be appreciated that the semiconductor layer 202 may be comprised of any appropriate material or material composition that is suitable for forming therein and thereon circuit elements, such as transistors, capacitors, resistive structures and the like. The semiconductor layer 202 may be considered, at least partially, as an active region, in which a dopant profile is to be established so as to obtain a desired degree of conductivity in accordance with device requirements. The substrate 201 may represent any appropriate carrier material for forming thereabove a semiconductor layer 202 wherein the substrate 201 may be comprised of a substantially crystalline semiconductor material, possibly in combination with an insulating layer formed below the semiconductor layer 202, thereby providing an SOI configuration and the like. For instance, the substrate 201 and the semiconductor layer 202 may have the same characteristics, as previously described with reference to the semiconductor device 100. Moreover, in this manufacturing stage, the device 200 may comprise a first device region 200A and a second device region 200B, which may represent neighboring device regions, for instance, if neighboring transistor elements are considered, or which represents distant device portions in which different types of circuitries and the like may be provided. For instance, the first device region 200A may represent a part of an analog circuit, while the second device region 200B may represent a portion of a digital circuit, or the first and second regions 200A, 200B may represent different digital circuit areas, such as memory area and a logic portion, which may include transistor elements of similar configuration yet requiring different performance characteristics, for instance, in view of leakage currents, switching speed, threshold voltage and the like. The first and second device regions 200A, 200B may each comprise a device feature 205 which may be formed above the semiconductor layer 202 and which may represent a conductive, semiconductive or insulating region which may shield an area of the semiconductor layer 202 located below the device feature 205. In some illustrative embodiments, the device features 205 may represent gate electrode structures of field effect transistors, as will be explained later on in more detail. In other cases, the device features 205 may represent conductive lines or regions, such as polysilicon lines and the like, or may represent extended semiconductor regions for forming capacitive structures, while in other cases, the device features 205 may represent resistive structures. For example, the device features 205 may be formed on an insulating layer 204, when the device features 205 are comprised of a conductive or a semiconductive material which may not directly connect to the semiconductor layer 202.

Furthermore, in this manufacturing stage, a first sidewall spacer structure 213A may be provided at sidewalls of the device feature 205 in the first device region 200A, while a second sidewall spacer structure 213B may be provided in the second device region 200B. In illustrative embodiments, the spacer structures 213A, 213B may be comprised of any appropriate material, such as silicon dioxide, silicon nitride, silicon oxynitride and the like, and may also have substantially the same configuration and thus the same spacer width 213W. In the embodiment shown, the configuration of the spacers 213A, 213B may be selected so as to comply with an implantation process 221 that is to be performed on the basis of an implantation mask 220, such as a resist mask, in order to provide a desired dopant profile in the semiconductor layer 202 corresponding to the first device region 200A. That is, the spacers 213A, 213B, which may have the same configuration, are designed in such a manner, i.e., the spacer width 213W is selected such that, in combination with respective process parameters of the process 221, a target dopant concentration profile is obtained in the first device region 200A, which may, in the embodiment shown, require a higher offset with respect to the device region 205 of the first region 200A compared to an offset in the second device region 200B, as will be described later on in more detail.

With respect to a manufacturing sequence for forming the semiconductor device 200, similar processes may be used as previously described when referring to the device 100 when transistor elements are considered. In other cases, any other appropriate manufacturing techniques may be used in accordance with well-established process strategies wherein, however, contrary to conventional approaches, a respective manufacturing process for forming the spacer structures 213A, 213B is designed to obtain the spacer width 213W specifically selected in accordance with performance characteristics the device feature 205 in the first region 200A. For example, an appropriate spacer layer comprised of any suitable material, as previously mentioned, may be deposited and may be subsequently etched, for instance, on the basis of wet chemical etch recipes, plasma assisted etch recipes and the like, to obtain the target width 213W. Thereafter, the implantation mask 220 may be formed on the basis of well-established masking regimes, wherein, in some illustrative embodiments, the mask 220 may be formed according to a conventional process strategy, when different implantation recipes have to be used for the first and second regions 200A, 200B in order to obtain the desired device characteristics. For instance, if the device features 205 represent gate electrode structures of transistors of different conductivity type, the implantation mask 220 may be necessary to avoid the introduction of unwanted species in the second device region 200B. Consequently, the process parameters, such as dose, energy, possibly an implantation angle, dopant species and the like, may be selected to provide the desired dopant profile, while additionally the width 213W may specifically determine a target offset with respect to the device feature 205 in the first device region 200A.

Figure 2B:
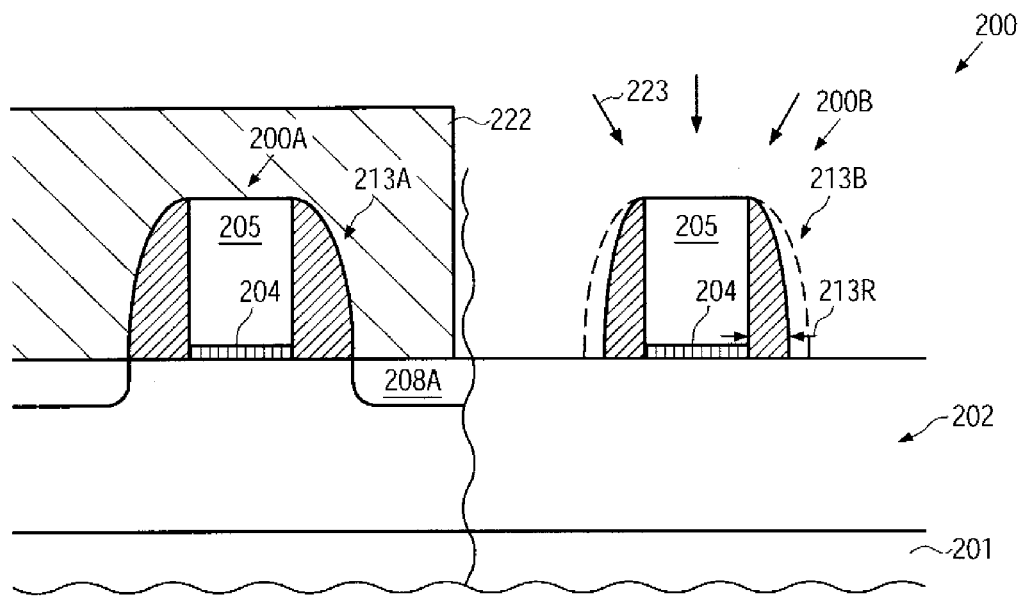

FIG. 2b schematically illustrates the semiconductor device 200 with an implantation region 208A having a lateral offset to the device feature 205 that is determined by the spacer width 213W. Moreover, a further implantation mask 222 may be provided in order to cover the first device region 200A while exposing the second device region 200B. Additionally, the semiconductor device 200 is subjected to an etch process 223, which may be designed to selectively remove material of the spacer structure 213B in order to obtain a reduced width 213R that is selected in accordance with the characteristics of a subsequent implantation process for establishing a required dopant profile within the second device region 200B. The etch process 223 may be performed as a wet chemical etch process and/or a plasma assisted etch process, depending on the process requirement. For instance, highly selective plasma assisted etch processes are well established for typical spacer materials, such as silicon nitride, wherein a silicon dioxide layer may provide high etch stop capabilities. In this case, in some illustrative embodiments, a respective oxide liner (not shown) may be provided between the device feature 205 and also on horizontal surface portions of the semiconductor layer 202, which may even be maintained during the implantation process 221 to enhance the etch stop capabilities during the process 223 and also suppress undue damage of the underlying semiconductor material. In other cases, the process 223 may exhibit a sufficiently high etch selectivity with respect to the material of the semiconductor layer 202, as is for instance shown in FIG. 2*b*. Depending on the degree of isotropy of the etch process 223, a reduction in height of the spacer structure 213B may also be obtained, wherein corresponding reduction may be less critical, unless a sufficient shielding effect during the subsequent implantation process may be achieved. Also, the etch process 223 may comprise wet chemical etch processes, for instance based on appropriate etch chemistry, such as hot phosphoric acid, when the spacer 213B is comprised of silicon nitride. However, any other appropriate etch chemistry may be used, depending on the material composition of the spacer structure 213A, 213B.

Figure 2C:
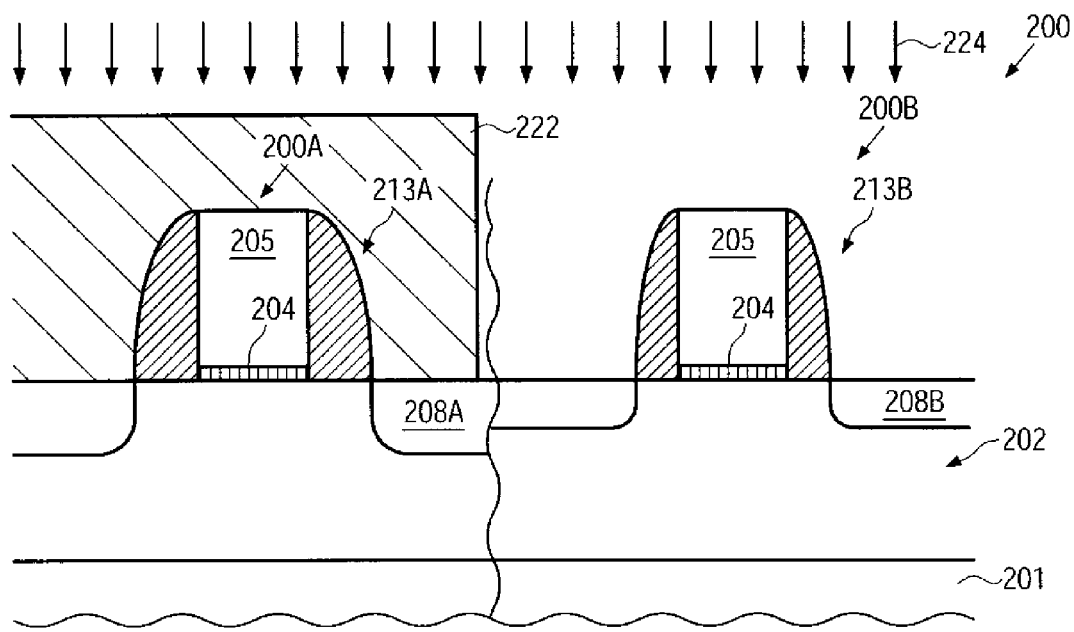

FIG. 2*c* schematically illustrates the semiconductor device 200 during a further implantation step 224 performed on the basis of the mask 222 in which a desired dopant species may be introduced into the exposed portion of the layer 202 on the basis of appropriately selected implantation parameters, wherein additionally the width 213R may provide the desired offset with respect to the device feature 205 in the region 200B. Thus, the implanted region 208B may be obtained, which may have a lateral and vertical profile selected to obtain enhanced performance characteristics of the device feature 205 in the device region 200B.

Figure 2D:
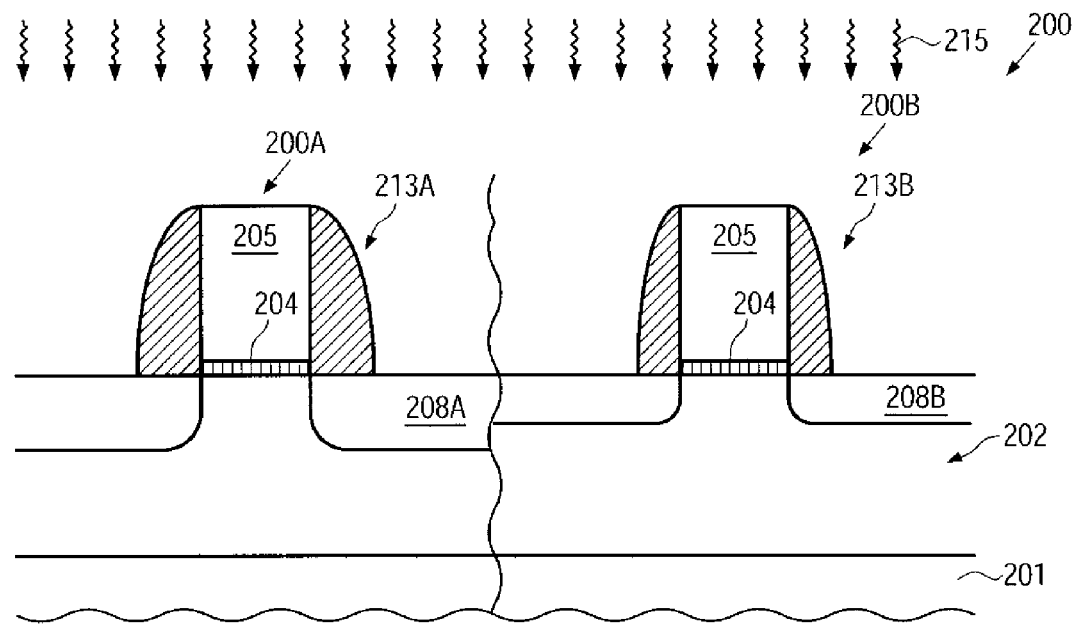

FIG. 2*d* schematically illustrates the semiconductor device 200 after the removal of the implantation mask 222 and during an anneal process 215 for activating the dopants in the regions 208A, 208B while also re-crystallizing implantation-induced damage. The anneal process 215 may thus result in a "final" dopant profile, when any further high temperature processes may not be performed so that the final dopant profile of the regions 208A, 208B may individually correspond to desired dopant profiles for the regions 200A, 200B. As previously explained, the anneal parameters of the process 215 may also have a significant influence on the final dopant profile of the regions 208A, 208B wherein, in the embodiments shown, the implantation parameters and the spacer widths 213W, 213R may be appropriately selected to obtain the desired final profile on the basis of the predefined parameters of the process 215.

Thereafter, the further processing may be continued, for instance, by modifying the overall conductivity of the regions 208A, 208B and the device features 205, for instance on the basis of forming metal silicide regions when the semiconductor layer 202 comprises a significant amount of silicon and when the device features 205 may be comprised of a silicon-containing material. In other cases, a significant amount of the entire device features 205 may be replaced by other appropriate materials, such as metal-containing materials and the like, if, for instance, sophisticated gate electrode structures of advanced field effect transistors are considered.

With reference to FIGS. 3*a*-3*d*, further illustrative embodiments will now be described in which transistor elements of the same or different conductivity types may receive implantation species on the basis of individually adapted sidewall spacer structures, wherein, in some illustrative embodiments, one or both of the transistor elements may comprise specifically designed semiconductor materials, at least in drain and source areas of the transistors.

Figure 1D:
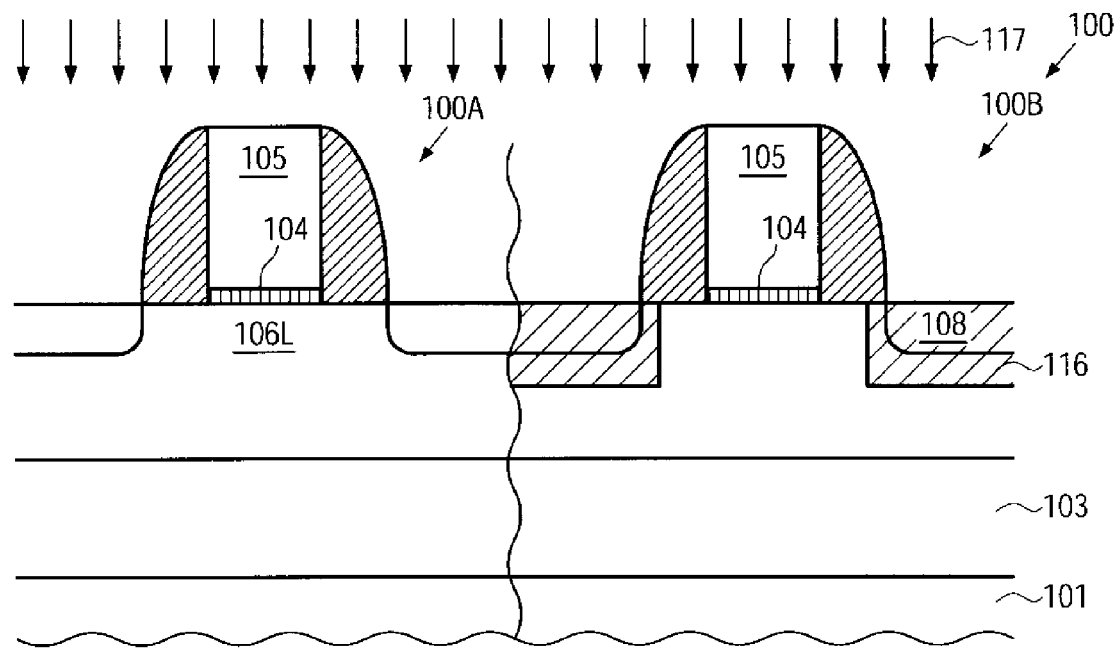
FIGS. 1d-1e schematically illustrate cross-sectional views of a highly advanced semiconductor device including a P-channel transistor and a high performance P-channel transistor including a silicon/germanium alloy, wherein both transistors are formed on the basis of the same sidewall spacer structure in order to obtain a dopant profile in the drain and source regions, according to conventional strategies.
Figure 1E:
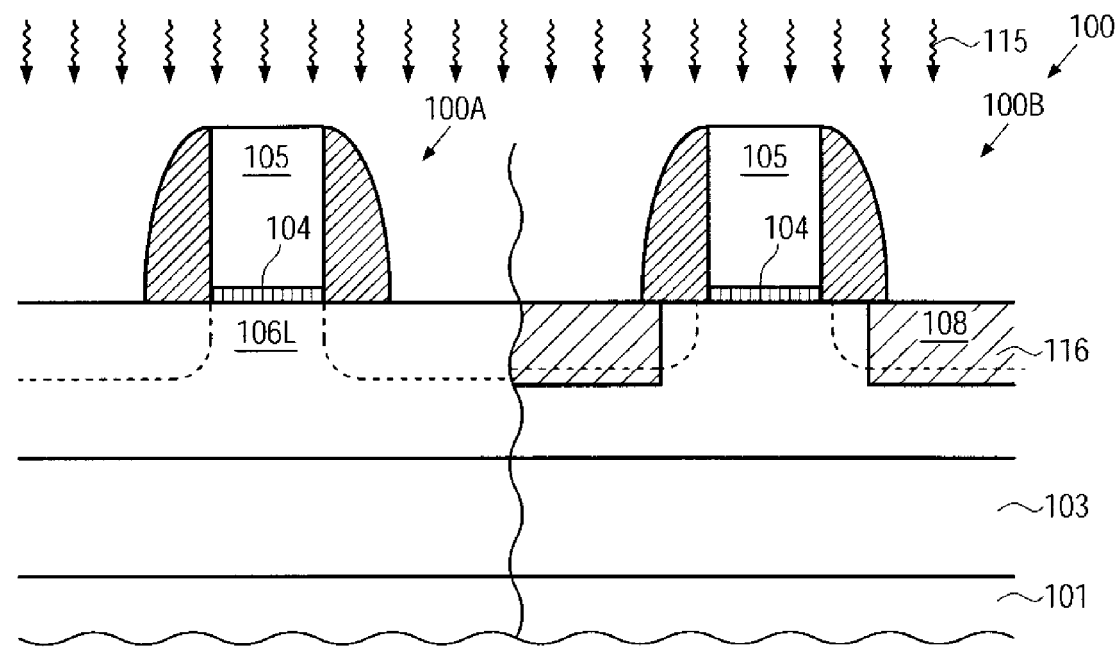
Figure 3A:
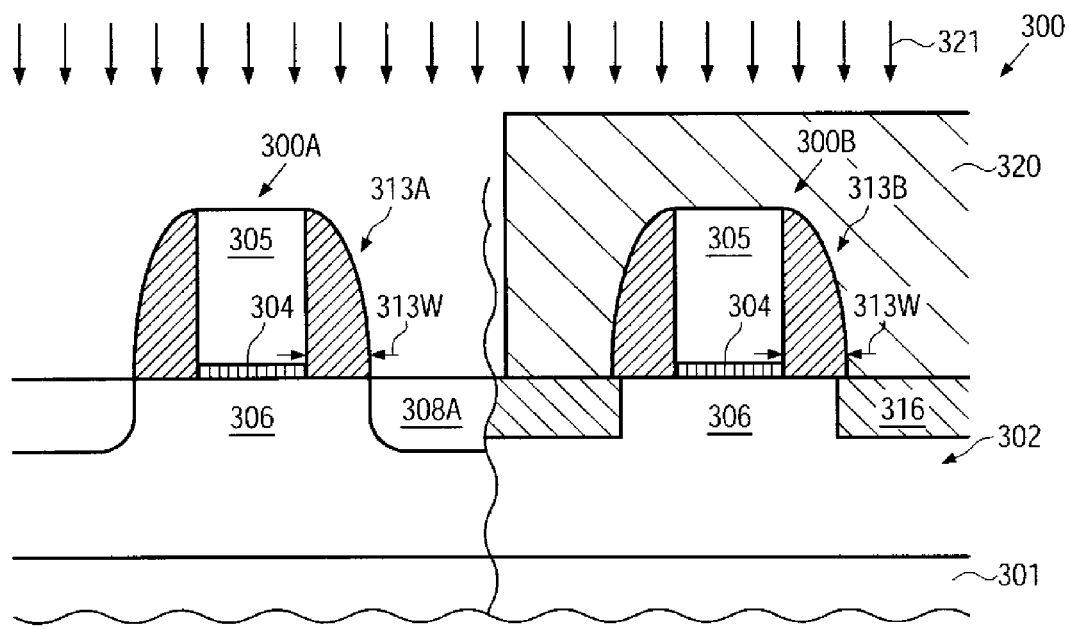
FIGS. 3a-3d schematically illustrate cross-sectional views of field effect transistors of different configurations, wherein one of the transistors comprises a semiconductor alloy to enhance transistor performance while an actual dopant profile in the drain and source regions may be established individually by appropriately adapting the spacer width, according to further illustrative embodiments.

FIG. 3*a* schematically illustrates a semiconductor device 300 comprising a first transistor 300A and a second transistor 300B, which may be formed on different device areas which may represent neighboring device areas or distant device areas, as previously explained with reference to the device 200. In the manufacturing stage shown, the first and second transistors 300A, 300B may comprise a gate electrode structure 305 including a gate insulation layer 304. Furthermore, a sidewall spacer structure 313A may be formed on sidewalls of the gate electrode 305 of the first transistor 300A, while a second sidewall spacer structure 313B may be formed on sidewalls of the gate electrode structure 305 of the second transistor 300B. Furthermore, one or both of the transistors 300A, 300B may comprise a specifically designed semiconductor material, such as a strained semiconductor alloy, for instance in the form of silicon/carbon, silicon/germanium, silicon/tin, silicon/germanium/tin and the like. For convenience, a respective specifically designed semiconductor material, for instance in the form of a semiconductor alloy, may be shown in the second transistor 300B, indicated as 316, which may be located in an area corresponding to drain and source regions still to be formed on the basis of an implantation process. For example, the material 316 may represent a silicon/germanium alloy in a strained state, where the transistor 300B may represent a P-channel transistor formed on a silicon-based layer 302 having a standard crystallographic orientation. As previously explained, the selective provision of specifically designed semiconductor materials, such as the material 316, may result in different characteristics, for instance in view of diffusivity of specific dopant species, compared to other areas of the semiconductor layer 302 that have not received the material 316 or which may comprise another type of semiconductor material. For example, it may be assumed that the transistors 300A, 300B are of the same conductivity type, however, requiring different performance characteristics, for instance with respect to leakage currents, operating speed and the like, as previously explained with reference to the FIGS. 1*d*-1*e*.

The semiconductor device 300 may be formed on the basis of well-established process techniques, including, for instance, the selective epitaxial deposition of the material 316, or any other appropriate process technique for forming the material 316 within the layer 302, wherein the sidewall spacer structures 313A, 313B may be formed in a common manufacturing sequence while adjusting the process parameters such that a spacer width 313W is selected to enhance the overall performance of the device 300A with respect to drain and source regions 308A created by an implantation process 321 on the basis of an implantation mask 320.

Figure 3B:
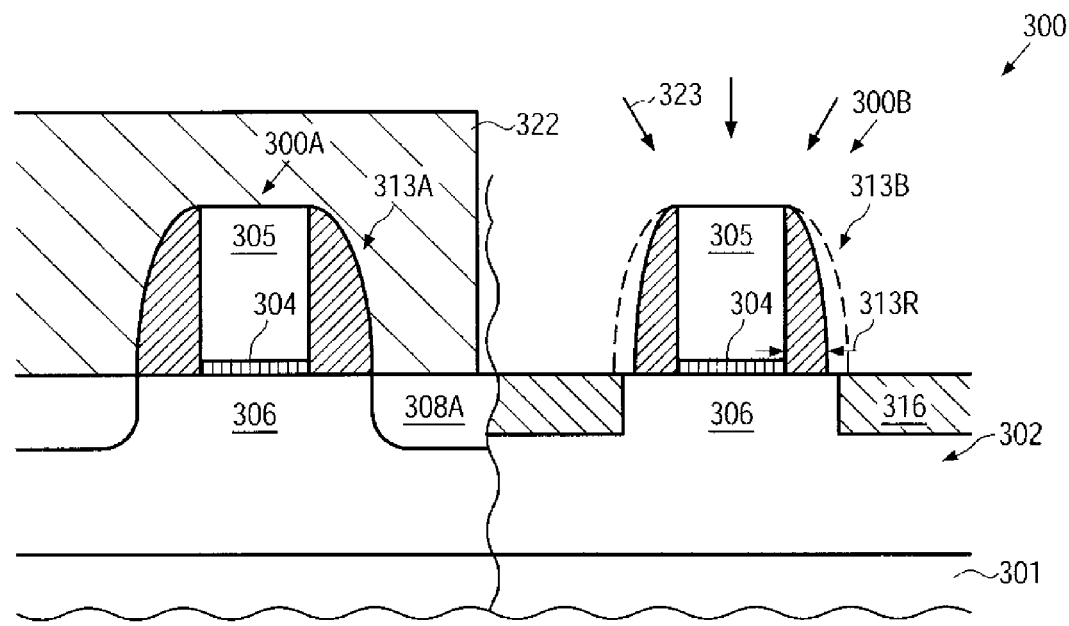

FIG. 3*b* schematically illustrates the device 300 in a further advanced manufacturing stage, in which a further implantation mask 322 covers the first transistor 300A while exposing the second transistor 300B. During an etch process 323, the width of the spacer structure 313B may be adjusted to a reduced width 313R which may be selected to shift the point of implantation closer to the channel region 306 when, for instance, the diffusion activity of the dopant species under consideration may be less due to the provision of the semiconductor material 316.

Figure 3C:
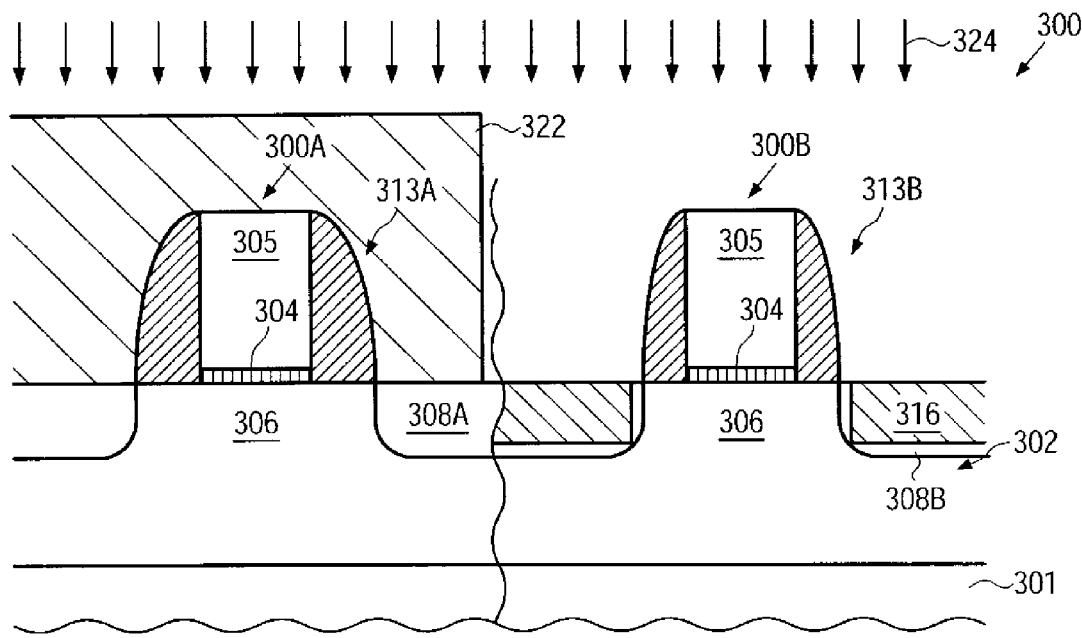

FIG. 3*c* schematically illustrates the semiconductor device 300 during a further implantation process 324 in order to obtain the drain and source regions 308B with a desired profile as implanted. For example, the implantation process 324 may be performed on the basis of the same process parameters when the transistors 300A, 300B may represent transistors of the same conductivity type and the vertical extension of the drain and source regions 308B as implanted may be less critical, thereby reducing process complexity with respect to the implantation processes 321 and 324. In other cases, the process parameters may be specifically designed for the device 300B, thereby providing, due to an individual adjustment of the width 313R, enhanced process conditions for obtaining the desired profile for the drain and source regions 308B.

Figure 3D:
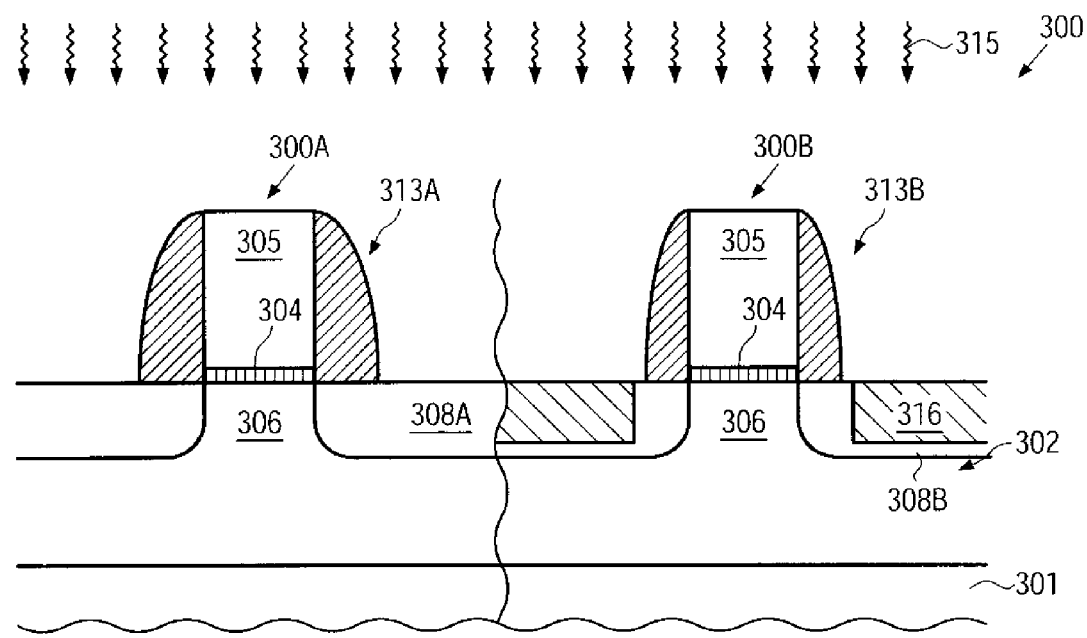

FIG. 3d schematically illustrates the semiconductor device 300 during an anneal process 315 to adjust the final dopant profile of the drain and source regions 308A, 308B if a subsequent high temperature treatment may not be performed in the device 300. Thus, the effective gate length, as well as the vertical extension of the drain and source regions 308A, 308B, may be individually adapted due to the possibility of appropriately selected implantation process parameters, as well as the spacer widths 313W and 313R.

It should be appreciated that, in other cases, the transistors 300A, 300B may represent transistors of different conductivity type, in which the implantation masks 320 and 322 may have to be provided at any case, thereby substantially not contributing to the overall process complexity, while still enabling an individual adaptation of the respective implantation profiles. In other cases, the transistors 300A, 300B may represent transistors of different types of circuitry, such as analog, digital and the like, or different digital logics, such as memory areas, CPU cores and the like, which may require a different parameter set for implantation processes. Also, in this case, the respective implantation masks 320, 322 may be advantageously used for individually adapting the spacer width 313W, 313R.

With reference to FIGS. 4a-4e, further illustrative embodiments will now be described in which highly complex dopant profiles may be obtained on the basis of the above-described principles, wherein two or more spacer elements may be used and one or more of these spacer elements may be subsequently individually adapted in spacer width in order to create the desired final dopant profile for respective circuit elements, such as capacitance structures, resistive structures, field effect transistors and the like.

Figure 4A:
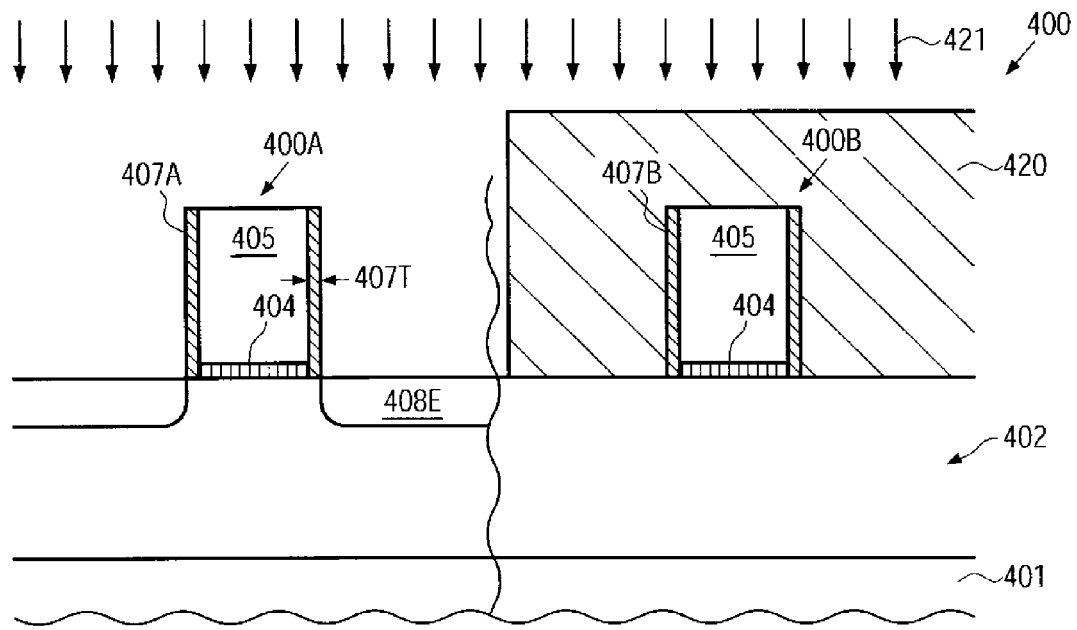
FIGS. 4a-4e schematically illustrate cross-sectional views of a semiconductor device during various manufacturing stages, wherein two or more spacer elements may be appropriately adapted in width prior to respective implantation processes in order to individually adjust the dopant profile, according to still further illustrative embodiments.

FIG. 4a schematically illustrates a semiconductor device 400 comprising a substrate 401 and a semiconductor layer 402 for which the same criteria apply as previously described for the devices 100, 200 and 300. Furthermore, first and second devices 400A, 400B may be provided wherein, for convenience, the devices will be referred to as a first transistor and a second transistor, since here typically highly sophisticated lateral and vertical dopant profiles may be required. The first and second transistors 400A, 400B may each comprise a gate electrode structure 405, which may, in this manufacturing stage, comprise any appropriate material composition. Furthermore, respective gate insulation layers 404 may be provided. Additionally, the first transistor 400A may comprise a first offset spacer 407A formed on sidewalls of the gate electrode 405 and similarly the second transistor 400B may comprise a second offset spacer 407B. The offset spacers 407A, 407B may have substantially the same configuration and thus the same width 407T, which may, in the embodiment shown, be designed to obtain a desired offset with respect to a shallow drain and source region, which may also be referred to as extension region 408E.

The semiconductor device 400 may be formed on the basis of processes as previously described with reference to the device 100, wherein, however, the width 407T is specifically adapted to the requirements for the transistor 400A. Thereafter, the extension region 408E may be formed on the basis of an appropriately designed implantation process 421 using an implantation mask 420. It should be appreciated that other implantation processes may have been performed on the basis of the mask 420, or without a mask 420, to prepare the semiconductor layer 402 for the creation of a desired dopant profile therein. For example, pre-amorphization implantation, halo implantations and the like may also be performed, depending on the process requirements.

Figure 4B:
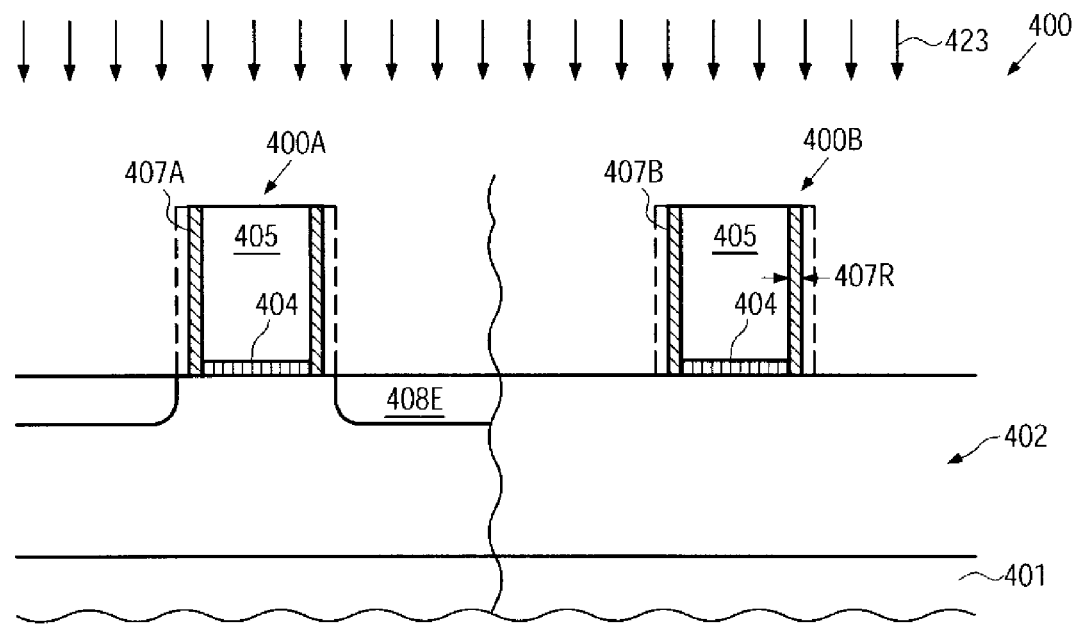

FIG. 4b schematically illustrates the semiconductor device 400 wherein, according to one illustrative embodiment, after the removal of the implantation mask 420, an etch process 423 may be performed on the basis of any appropriate etch technique, such as wet chemical etch, plasma assisted etch and the like, as previously explained, in order to reduce the offset spacers 407A, 407B, thereby obtaining a desired reduced width 407R selected to obtain a desired point of implantation for the second transistor 400B. Thus, in this embodiment, the etch process 423 may be performed as an unmasked etch process, thereby also creating the reduced width 407R in the first transistor element 400A. In this case, highly uniform process conditions may be obtained during the further processing of the device 400, for instance, when forming further spacer elements, as will be described later on. In other illustrative embodiments, the etch process 423 may be performed on the basis of a further implantation mask, as is explained with reference to embodiments described above.

Figure 4C:
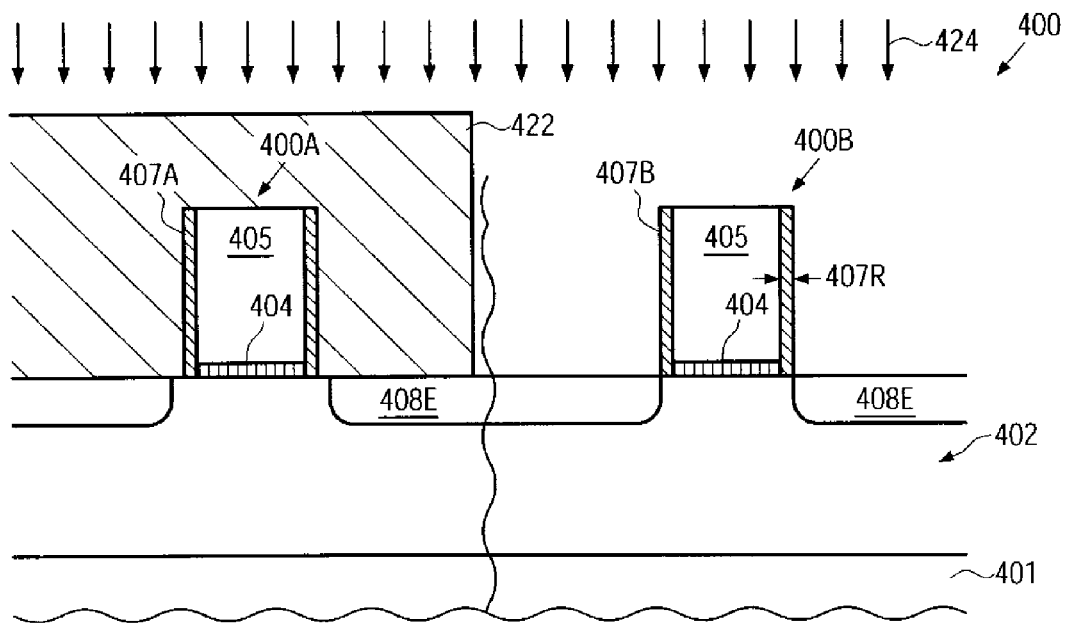

FIG. 4c schematically illustrates the semiconductor device 400 with a further implantation mask 422 in order to protect the first transistor 400A during a further implantation process 424, thereby obtaining an extension region 408E for the second transistor 400B, which is determined by the implantation process parameters and the reduced width 407R.

Figure 4D:
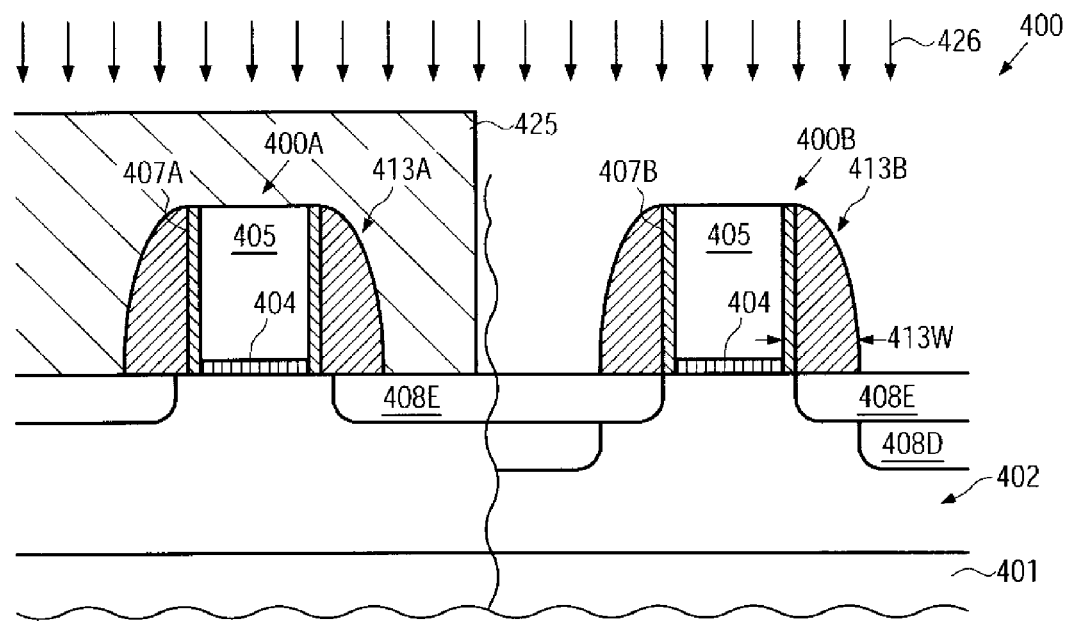

FIG. 4d schematically illustrates the semiconductor device 400 in a further advanced manufacturing stage, in which a spacer structure 413A, 413B is provided on the basis of the reduced offset spacers 407A, 407B, possibly in combination with intermediate spacer elements or liner materials (not shown). For example, in the embodiment shown, the spacer structure 413B having a width 413W may be designed to create a desired point of implantation, i.e., a desired offset with respect to the gate electrode 405 for the second transistor 400B. In other cases, the width 413W may have been selected to result in a desired offset for an ion implantation process for the transistor 400A. In the example shown, a further implantation mask 425 may thus be provided to cover the first transistor 400A while exposing the second transistor 400B to an implantation process 426 for forming deep drain and source regions 408D. Thus, in the second transistor 400B, a moderately high lateral extension of the extension region 408E may be considered advantageous, while, in other cases, when the width 413W is selected to be appropriate for the first transistor 400A, an increased offset of both the extension region 408E and of a respective deep drain and source region 408D would be obtained in this case (not shown).

Figure 4E:
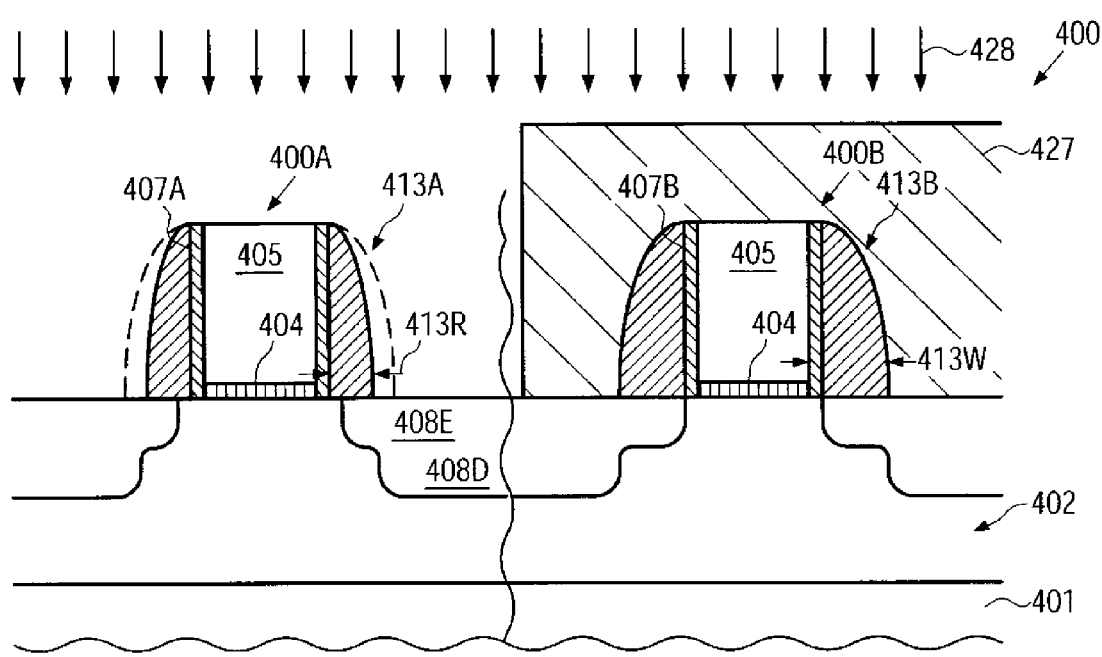

FIG. 4e schematically illustrates the device 400 with a further implantation mask 427 that covers the second transistor 400B while exposing the first transistor 400A to an etch ambient 428 to obtain a reduced spacer width 413R that is appropriate for the first transistor 400A, wherein any appropriate etch chemistry and technique may be used, as previously explained. Thereafter, a further implantation process may be performed on the basis of the mask 427 in order to create the deep drain and source regions 408D for the first transistor 400A, wherein, in the embodiment shown, a less pronounced lateral difference between the extension regions 407E and the deep regions 408D is obtained. It should be appreciated, however, that any other combination may be obtained, as previously discussed, to provide a highly sophisticated lateral and vertical dopant profile, which may be adjusted on the basis of the implantation parameters in combination with the individually adjusted width of the offset spacers 407A, 407B and the spacer structures 413A, 413B. Thereafter, the further processing may be continued by performing an anneal process in order to obtain the dopant profile based on the regions 407E, 408D as shown in FIG. 4d. It should be appreciated that the spacer structures 413A, 413B may even include more than two spacer elements, at least some of which may be individually adapted prior to a respective implantation process to obtain enhanced performance for each of the transistor devices.

Figure 5A:
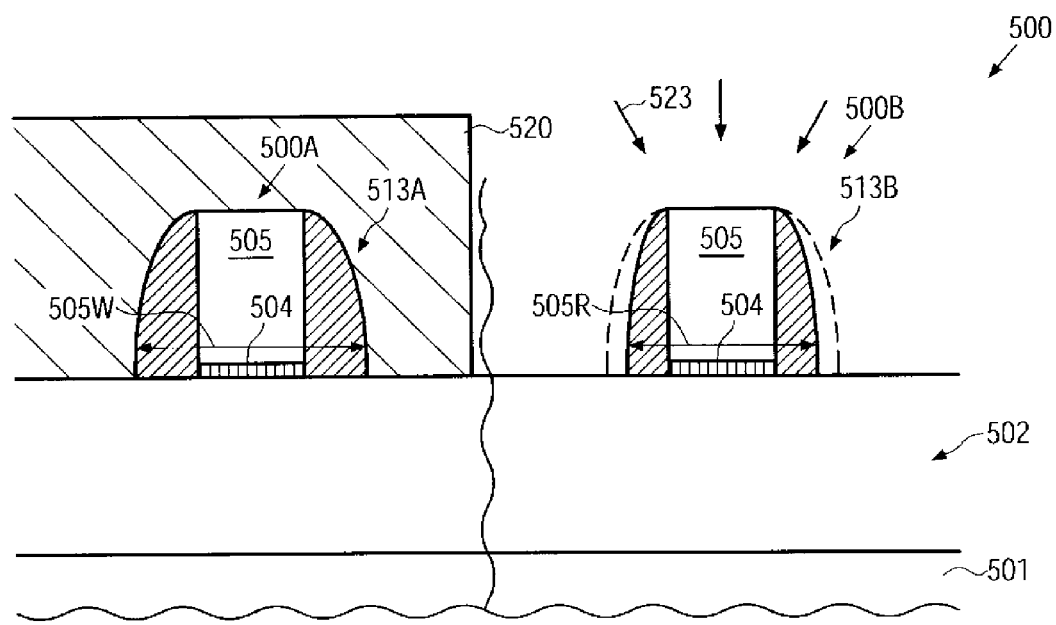
FIGS. 5a-5b schematically illustrate cross-sectional views for individually adjusting a spacer width in correlation with a respective masking and implantation scheme, according to further illustrative embodiments.
Figure 5B:
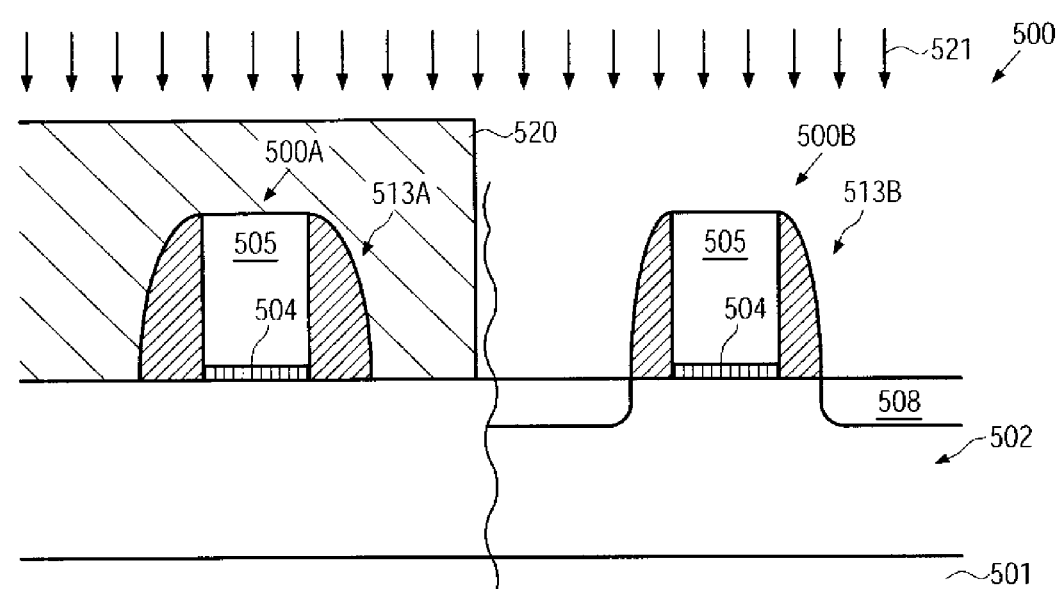

With reference to FIGS. 5a-5b, further illustrative embodiments are described in which the sequence of introducing dopant species may be inversed.

FIG. 5a schematically illustrates a semiconductor device 500 comprising a substrate 501 and a semiconductor layer 502 with a first device region 500A and a second device region 500B with respective device features 505 formed therein. Furthermore, an implantation mask 520 may be provided to cover the first device region 500A and to expose the second device region 500B to an etch ambient 523. The etch ambient 523 is designed to reduce a lateral extension of the device feature 505, wherein, for example, a spacer structure may be provided, or wherein the device feature 505 may per se be etched to obtain a reduced lateral size. Thus, after the etch process 523, the device feature 505 in the first region 500A may still exhibit the initial thickness 505W, while the device feature 505 in the second device region 500B may have the reduced width 505R.

FIG. 5b schematically illustrates the device 500 during an implantation process 520 to form implantation regions 508 on the basis of the reduced width 505R, possibly in combination with individually adjusted implantation parameters, as previously explained. Thereafter, the implantation mask 520 may be removed and a further implantation mask may be formed to cover the second device region 500B in order to create a respective implantation region in the first region 500A on the basis of the initial width 505W.

It should be appreciated that the embodiments illustrated above may be combined in any way in order to selectively reduce the lateral extension of a device feature prior to an implantation process so as to obtain the desired dopant profile.

With reference to FIGS. 6a-6e, further illustrative embodiments will now be described in which an individual modification of the width of a spacer structure may be accomplished by a deposition process to increase the respective shielding effect during a subsequent implantation process.

Figure 6A:
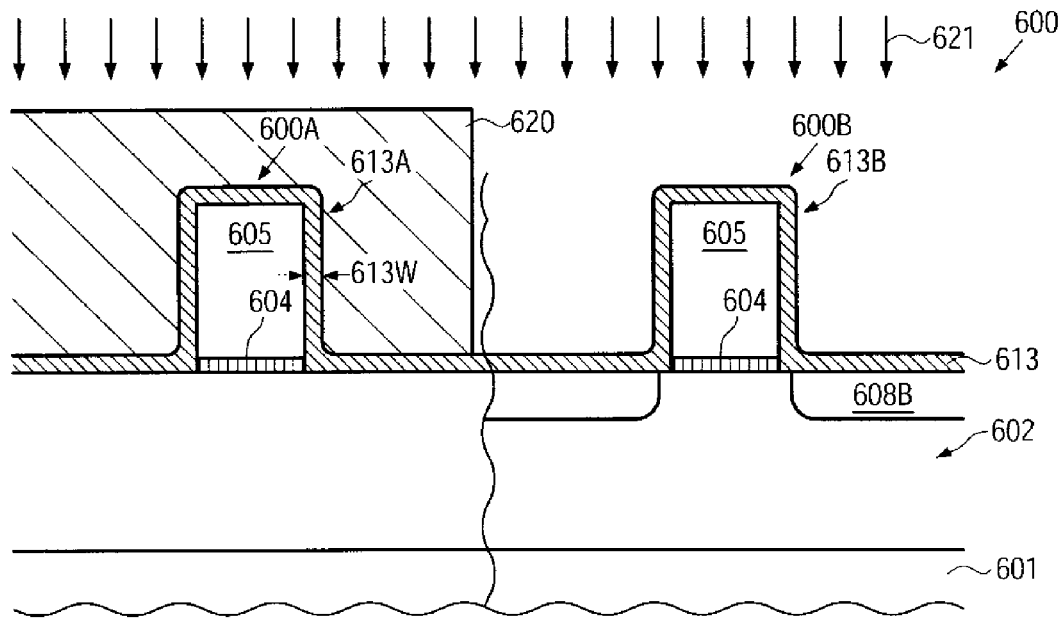
FIGS. 6a-6e schematically illustrate cross-sectional views of a semiconductor device, in which a spacer width is adapted prior to implantation on the basis of a deposition process, according to yet other illustrative embodiments.

FIG. 6a schematically illustrates a semiconductor device 600 comprising a first circuit element 600A, such as a field effect transistor, and a second circuit element 600B, such as a field effect transistor and the like. Furthermore, a substrate 601 and a semiconductor layer 602 may be provided and may have similar configurations, as previously explained. Moreover, in this manufacturing stage, device features 605, possibly in combination with an insulation layer 604, may be provided, for instance in the form of gate electrode structures, wherein sidewall spacer structures 613A, 613B may be provided in the form of a spacer layer 613 which, in the embodiment shown, may still cover horizontal portions of the semiconductor layer 602. The spacer layer 613 may have an appropriate thickness to provide the desired offset of an implantation region 608B with respect to the device feature 605 in the device 600B during an implantation process 621 performed on the basis of a respective implantation mask 620.

It should be appreciated that the semiconductor device 600 may be formed on the basis of well-established techniques for forming the device features 605 and the insulation layer 604, for instance on the basis of well-established manufacturing strategies for gate electrode structures and the like. Thereafter, the spacer layer 613 may be formed on the basis of well-established deposition techniques, such as plasma enhanced chemical vapor deposition (PECVD), wherein the spacer layer 613 may comprise an etch stop material, if required (not shown). Thus, the sidewall spacer structures 613A, 613B may have substantially the same configuration and the same width or thickness at this manufacturing stage. In the embodiment shown, the process parameters of the implantation process 621 may be appropriately selected, for instance, with respect to implantation energy, to deposit the dopant species under consideration in the region 608B with a required vertical extension.

Figure 6B:
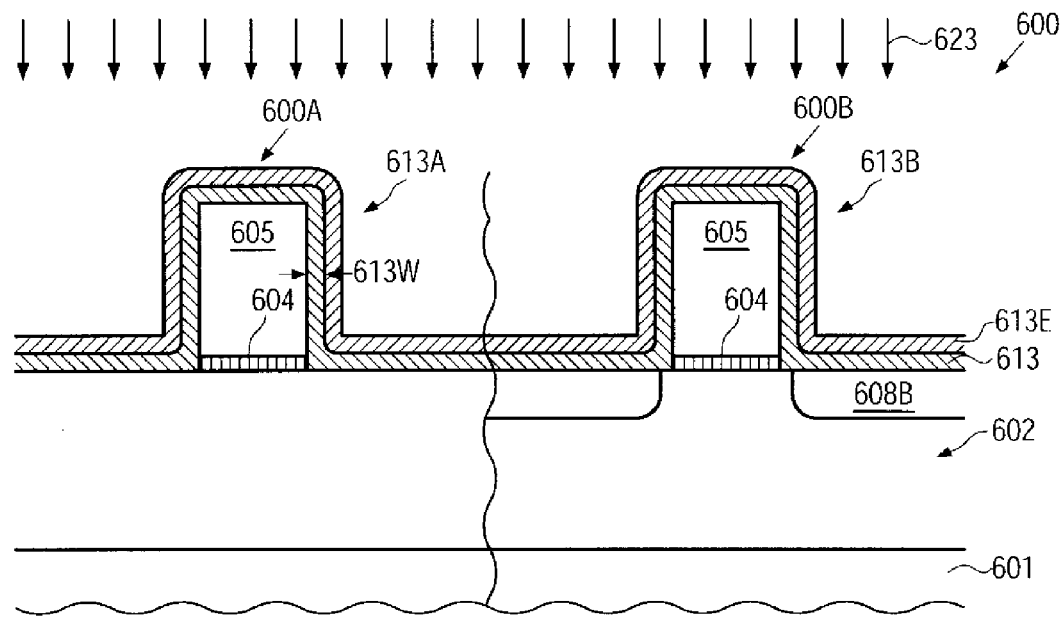

FIG. 6b schematically illustrates the semiconductor device 600 in a further advanced manufacturing stage, in which a deposition process 623 is performed, in which the same or a different material as in the spacer layer 613 may be deposited in order to obtain an increased width of the spacer structures 613A, 613B by providing a spacer layer 613E. After the deposition process 623, any appropriate etch process, such as an anisotropic selective etch process, may be performed using well-established recipes to remove the materials of the layers 613, 613E from horizontal device portions wherein, if desired, a respective etch stop layer (not shown) may provide enhanced control of the process 623.

Figure 6C:
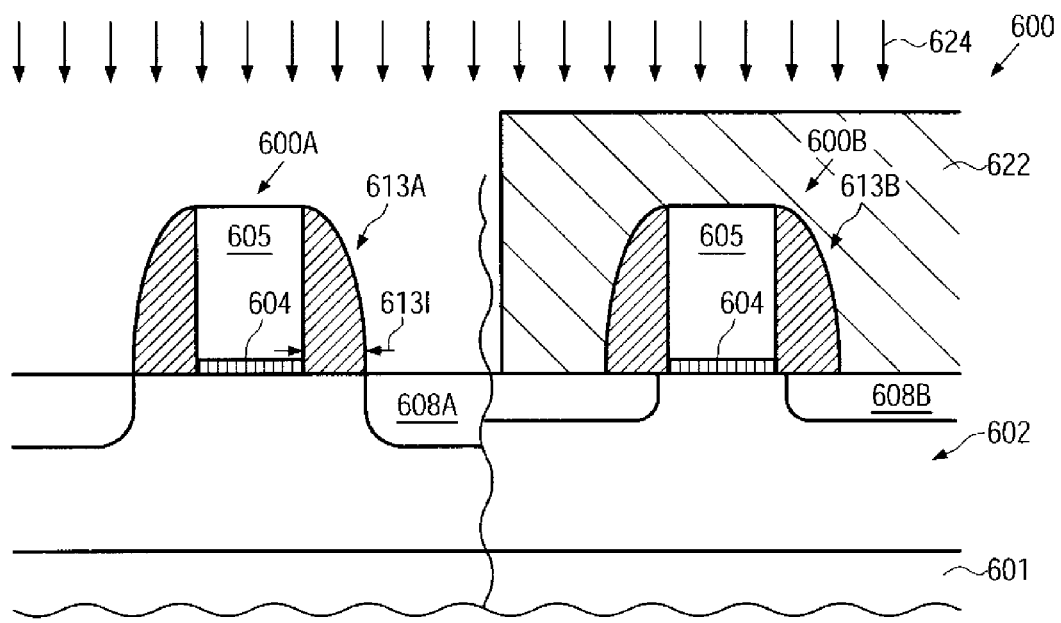

FIG. 6c schematically illustrates the semiconductor device 600 after the above-described process sequence, resulting in spacer structures 613A, 613B having an increased spacer width 613I that is selected to conform to the requirements for the first circuit element 600A during a further implantation process 624 performed on the basis of an implantation mask 622 that covers the second circuit element 600B. Thus, a respective implantation region 608A may be formed on the basis of the width 613I, thereby also enabling an individual adjustment with respect to the device 600A, similarly as is described in the above embodiments.

Figure 6D:
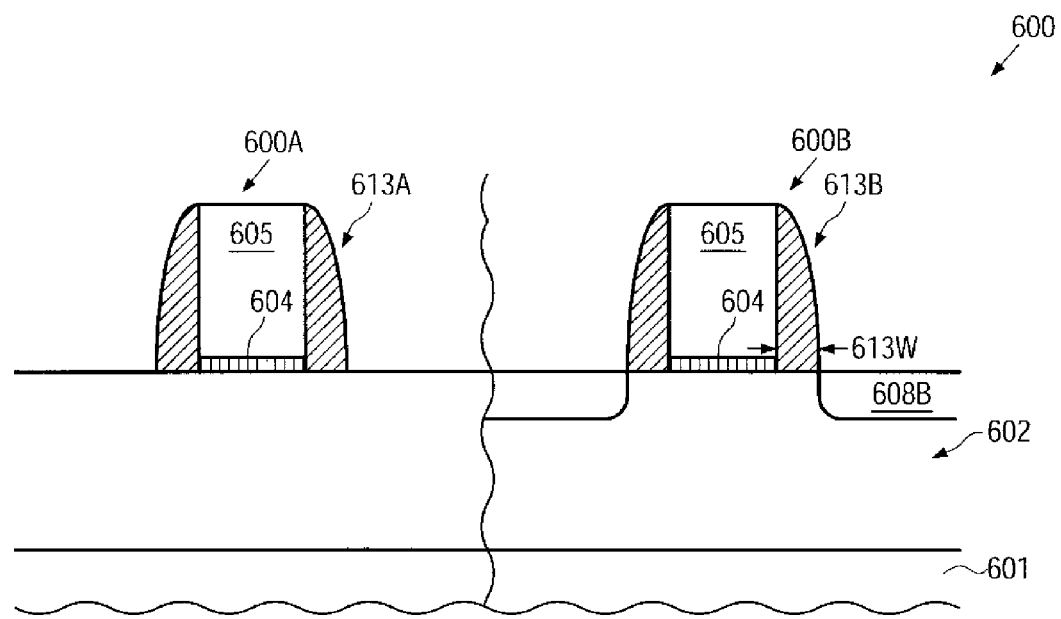

FIG. 6d schematically illustrates the semiconductor device 600 according to further illustrative embodiments wherein the spacer structures 613A, 613B may have been formed on the basis of well-established spacer techniques with the width 613W thereby enabling enhanced device performance for the circuit element 600B. That is, the implantation region 608B may be formed on the basis of appropriately selected implantation parameters and the width 613W.

Figure 6E:
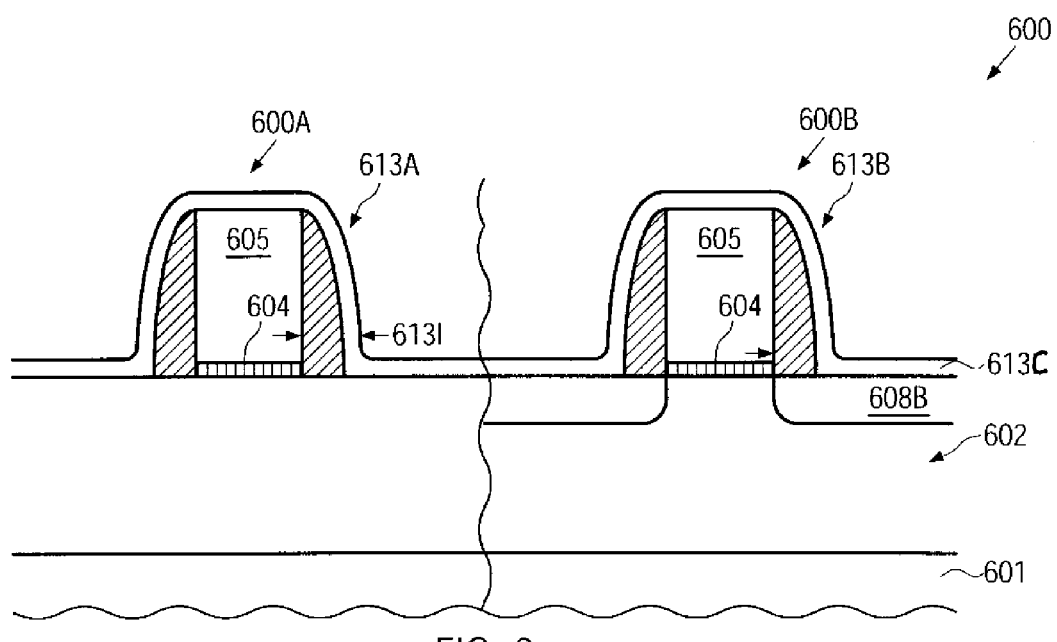

FIG. 6e schematically illustrates the device 600 in a further manufacturing stage in which an additional spacer layer 613C may be provided to obtain the increased spacer width 613I in the first and second spacer structures 613A, 613B wherein the width 613I is selected to provide appropriate implantation conditions during a subsequent implantation process for forming a doped region in the first circuit element 600A. During the respective implantation process, the additional spacer layer 613C may remain unpatterned, thereby requiring an adaptation of the implant energy in order to take into account the thickness of the layer 613C with respect to a desired penetration depth in the first circuit element 600A. In other illustrative embodiments, the spacer layer 613C may be patterned, for instance, on the basis of an anisotropic etch process to substantially remove the material thereof from horizontal device portions.

As a result, the methods and semiconductor devices disclosed herein enable the individual adaptation of the point of implantation, i.e., the adaptation of a lateral offset with respect to device features, such as gate electrode structures, conductive lines, capacitor electrode portions and the like, in order to individually enhance the resulting dopant profile in an active semiconductor region. For this purpose, the width of a corresponding spacer structure or the lateral extension of a respective device feature may be individually reduced in a respective mask implantation sequence, thereby reducing the overall process complexity, while nevertheless enabling individual adaptation of dopant profiles. For example, the transistor characteristics may be adapted in specific device regions on the basis of a manufacturing flow having high compatibility with conventional techniques, for instance, by appropriately reducing the width of a spacer structure on the basis of an implantation mask or prior to the provision of subsequent implantation masks, wherein, in some illustrative aspects, except for the spacer modification process, no additional processes may be required, if the implantation masks have to be provided in any case due to different implantation parameters required in different device regions. In this way, a highly localized adaptation of spacer structures may be accomplished, for instance, in complementary transistor pairs wherein, for instance, the spacer width of N-channel transistors and P-channel transistors may be individually adapted, while, in other cases, even larger device areas may receive differently adjusted spacer widths, while nevertheless substantially not contributing to overall process complexity. It should be appreciated that, in the embodiments described above, it has been referred to two different device regions, wherein the principles disclosed herein may be readily applied to any number of different device regions by sequentially reducing or increasing the spacer width in combination with appropriately selected masking regimes. Consequently a high degree of flexibility in adapting the performance of circuit elements may be provided wherein, in some illustrative aspects, no additional lithography processes may be required, while, in other cases, additional masking regimes may be implemented, thereby further enhancing the degree of freedom in selecting appropriate implantation conditions, since, in addition to different implantation parameters, a varying lateral width of the respective spacers may be used. When using the same implantation parameters for device features of basically the same configuration, such as transistors of the same conductivity type, different lateral dopant profiles may be obtained due to the individually adapted spacer widths.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
    forming a first device feature and a second device feature;
    forming a first sidewall spacer structure on sidewalls of said first device feature and a second sidewall spacer structure on sidewalls of said second device feature;
    forming a first implantation mask configured to expose a first device region comprising said first device feature and to cover a second device region comprising said second device feature;
    implanting a first dopant species into said first device region;
    modifying a width of said second sidewall spacer structure by etching said second sidewall spacer structure through an opening in a second implantation mask that covers the first device feature; and
    implanting a second dopant species into said second device region on the basis of the second implantation mask, wherein said second device region comprises a semiconductor alloy region, and wherein a portion of the second dopant species is implanted into the semiconductor alloy region.

2. The method of claim 1, wherein modifying a width of said second sidewall spacer structure comprises reducing the width of said second sidewall spacer structure to compensate for a reduced diffusion activity of the second dopant species in the semiconductor alloy region.

3. The method of claim 1, wherein a width of said second sidewall spacer structure is modified prior to forming said second implantation mask.

4. The method of claim 1, wherein a width of said second sidewall spacer structure is modified after forming said second implantation mask.

5. A method comprising:
    forming a first device feature and a second device feature;
    forming a first sidewall spacer structure on sidewalls of said first device feature and a second sidewall spacer structure on sidewalls of said second device feature;
    forming a first implantation mask configured to expose a first device region comprising said first device feature and to cover a second device region comprising said second device feature;
    implanting a first dopant species into said first device region;
    modifying a width of said second sidewall spacer structure, wherein modifying the width of said second sidewall spacer structure comprises increasing the width of said second sidewall spacer structure, and wherein increasing the width of said second sidewall spacer structure comprises depositing a spacer layer above said first and second device regions, and wherein said second implantation mask is formed above said spacer layer; and
    implanting a second dopant species into said second device region on the basis of a second implantation mask, said second implantation mask covering said first device region and exposing said second device region, wherein said second device region comprises a semiconductor alloy region, and wherein a portion of the second dopant species is implanted into the semiconductor alloy region.

6. The method of claim 1, wherein modifying a width of said second sidewall spacer structure and implanting said second dopant species is performed prior to forming said first implantation mask and implanting said first dopant species.

7. The method of claim 1, wherein said first device feature represents a gate electrode structure of a first field effect transistor and said second device feature represents a gate electrode structure of a second field effect transistor.

* * * * *